(12) United States Patent
Lin

(10) Patent No.: US 11,891,694 B2
(45) Date of Patent: Feb. 6, 2024

(54) ATOMIC-LAYER-DEPOSITION EQUIPMENT AND ATOMICLAYER-DEPOSITION METHOD BY USING THE SAME

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 234 days.

(21) Appl. No.: 17/562,882

(22) Filed: Dec. 27, 2021

(65) Prior Publication Data

US 2023/0203653 A1    Jun. 29, 2023

(51) Int. Cl.
*C23C 16/455*  (2006.01)
*H01L 21/673*  (2006.01)
*H01L 21/687*  (2006.01)

(52) U.S. Cl.
CPC .. *C23C 16/45544* (2013.01); *C23C 16/45527* (2013.01); *C23C 16/45563* (2013.01); *H01L 21/67346* (2013.01); *H01L 21/68792* (2013.01)

(58) Field of Classification Search
CPC ......... H01L 21/68792; H01L 21/67346; C23C 16/4544
See application file for complete search history.

(56) References Cited

U.S. PATENT DOCUMENTS

2017/0121822 A1*  5/2017  Mizutani ............... C23C 18/168

* cited by examiner

*Primary Examiner* — Joseph A Miller, Jr.
(74) *Attorney, Agent, or Firm* — Chun-Ming Shih; HDLS IPR SERVICES

(57) ABSTRACT

An atomic-layer-deposition equipment, includes a reaction chamber, a carrier, a coverage mechanism and a dispensing unit. The carrier and the dispensing unit are disposed within a containing space of the reaction chamber. The coverage mechanism includes a connecting shaft and a cover plate, wherein the cover plate is disposed within the containing space and faces the carrier, the connecting shaft is connected to the cover plate and extends through the reaction chamber. The carrier is configured to carry a substrate assembly and move the substrate assembly with respect to the coverage mechanism, so as to allow the cover plate contacting a top surface of the substrate assembly. When the cover plate contacts the top surface of the substrate assembly, the dispensing unit surrounds the substrate assembly and dispenses a precursor to a lateral surface of the substrate assembly, so as to form a protective layer thereon.

14 Claims, 4 Drawing Sheets

ATOMIC-LAYER-DEPOSITION EQUIPMENT AND ATOMICLAYER-DEPOSITION METHOD BY USING THE SAME

TECHNICAL FIELD

The present disclosure relates to an atomic-layer-deposition (ALD) equipment, and an atomic-layer-deposition method performed thereby, wherein the ALD equipment is configured to form a protective layer on lateral surface of a substrate assembly including bonded substrates.

BACKGROUND

Manufacturing of semiconductor devices is mainly to perform certain processes, such as oxidation, photolithography, etching, ion implantation and thin-film-deposition, etc., so as to form electronic components on substrates. As the manufacturing completed, a packaging process will be performed thereafter, which is to dice the substrate into chip dies. The next is to mount the chips on lead frames, and then to further process with wire-bonding and encapsulation.

As integral-circuit technology evolves, electronic products become smaller, along with high performance, reliability and intelligence. A new-generation semiconductor-packaging technology is to align chip dies on two stacked-up substrates, and combine the two substrates together by wafer-bonding process, and thereby to form a substrate assembly.

Thereafter, low-temperature thermal treatment, high-precision thinning and through-silicon via (TSV) processes will be sequentially performed to the substrate assembly, for further production. However during those processes, especially in a wet-etching TSV process, bonding portion(s) between the two substrates may be damaged, and therefore to result in a low product yield, quality of the semiconductors.

SUMMARY

As abovementioned, when performing the TSV process to the conventional substrate assembly an etchant applied in the process may contact the lateral surface of the substrate assembly, and then to erode and destruct the bonding portion between two assembled substrates. Therefore, the present disclosure provides a new atomic-layer-deposition equipment (hereafter as "ALD equipment"), which can perform an atomic-layer-deposition (ALD) process to the lateral surface of the substrate assembly, to form a protective layer on the lateral surface of the substrate assembly and on the bonding portion between the two assembled substrates, thereby to prevent the etchant from breaking off the bonding portion of the substrate assembly.

Accordingly, the present disclosure provides an ALD equipment, which includes a reaction chamber, a carrier, a coverage mechanism and a dispensing unit. The carrier, a portion of the coverage mechanism and the dispensing unit are disposed within a containing space of the reaction chamber. The carrier includes a carrying surface for carrying a substrate assembly. The substrate assembly includes a first substrate and a second substrate stacked on each other, the substrate assembly further includes a first surface facing the carrying surface, a second surface and at least one lateral surface.

The coverage mechanism includes a cover plate and a connecting shaft. The connecting shaft interconnects the reaction chamber and the cover plate, and the cover plate faces the carrying surface of the carrier. The carrier is configured to carry the first surface of the substrate assembly, and to move the substrate assembly carried by the carrier with respect to the coverage mechanism, so as to allow the cover plate of the coverage mechanism to contact and cover the second surface of the substrate assembly. Specifically, the carrier and the cover plate do not cover the lateral surface of the substrate assembly.

When the carrier and the cover plate respectively contact the first surface and the second surface of the substrate assembly, the dispensing unit surrounds the lateral surface of the substrate assembly and dispenses at least one precursor to the lateral surface, so as to form a protective layer on the lateral surface of the substrate assembly.

In more detail, the lateral surface of the substrate assembly is provided with a bonding portion. The bonding portion is the junction of the first substrate and the second substrate and forms as an annular cavity on the lateral surface. The ALD equipment according to the present disclosure is mainly configured to form a protective layer on the bonding portion of the substrate assembly, so as to protect the bonding portion from erosion and break-off by the etchant.

In at least one embodiment of the present disclosure, the coverage mechanism utilizes weight, resilient force of spring or motor power to apply a small pressure onto the substrate assembly on the carrier via the cover plate, in order to ensure that the cover plate fully contacts and covers the second surface (top surface) of the substrate assembly.

Moreover, in at least one embodiment of the present disclosure the dispensing unit has an annular appearance, and is formed with gas inlets disposed to surround the cover plate, the substrate assembly and/or the carrier. Therefore, the gas inlets face the lateral surface and dispense the precursor to the lateral surface and the bonding portion of the substrate assembly, so as to facilitate forming a protective layer thereon.

To achieve the abovementioned object(s), the present disclosure provides an ALD equipment, which includes a reaction chamber, a carrier, a coverage mechanism, a connecting shaft and a dispensing unit. The reaction chamber includes a containing space. The carrier is disposed within the containing space, and includes a carrying surface for carrying a substrate assembly. The substrate assembly includes a first substrate and a second substrate stacked on each other, the substrate assembly further includes a first surface facing the carrying surface, a second surface and at least one lateral surface positioned between the first surface and the second surface. The carrier is configured to cover the first surface of the substrate assembly. The coverage mechanism includes a cover plate disposed within the containing space to face the carrying surface of the carrier. The connecting shaft interconnects the reaction chamber and the cover plate, wherein the cover plate is configured to cover the second surface of the substrate assembly on the carrier. The dispensing unit is disposed to surround the cover plate, and is fluidly connected to the containing space of the reaction chamber. Also, the dispensing unit is configured to transfer and dispense at least one precursor toward the lateral surface of the substrate assembly, so as to form a protective layer on the lateral surface of the substrate assembly.

For more, the present disclosure also provides an atomic-layer-deposition method performed by the ALD equipment. The method includes: placing the substrate assembly on the carrier; covering the second surface of the substrate assembly by utilizing the cover plate of the coverage mechanism; and transferring and dispensing the precursor by utilizing the dispensing unit to the lateral surface of the substrate assembly, thereby to form the protective layer on the lateral surface of the substrate assembly.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
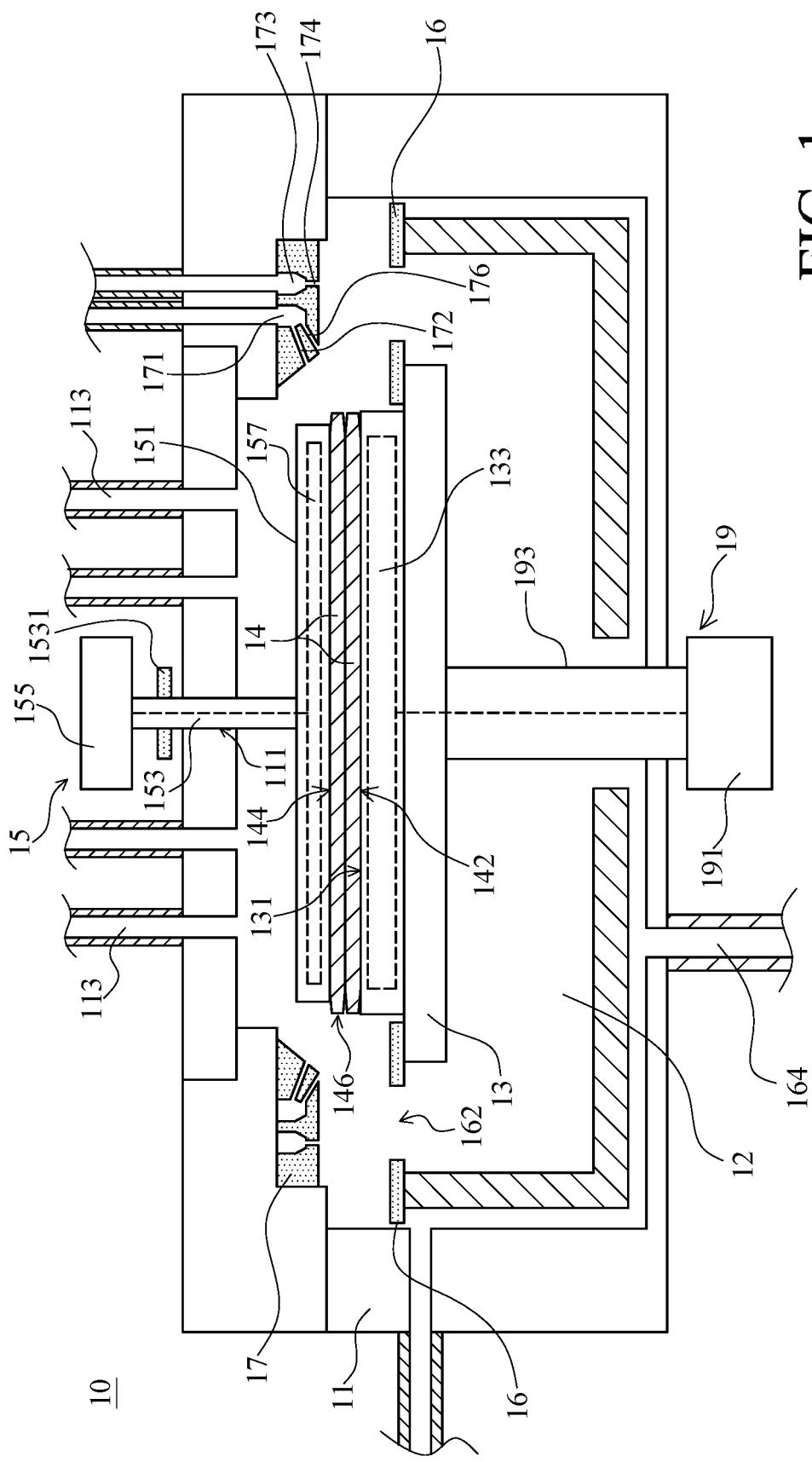
FIG. 1 is a cross-sectional view illustrating an atomic-layer-deposition equipment (ALD equipment) according to one embodiment of the present disclosure.

Referring to FIG. 1, which is a cross-sectional view illustrating an atomic-layer-deposition equipment 10 according to one embodiment of the present disclosure. As shown in FIG. 1, the atomic-layer-deposition equipment 10 (hereafter as "ALD equipment 10") includes a reaction chamber 11, a carrier 13, a coverage mechanism 15 and a dispensing unit 17. The reaction chamber 11 includes a containing space 12. The containing space 12 contains the carrier 13, a portion of the coverage mechanism 15, and the dispensing unit 17 within.

Figure 2:
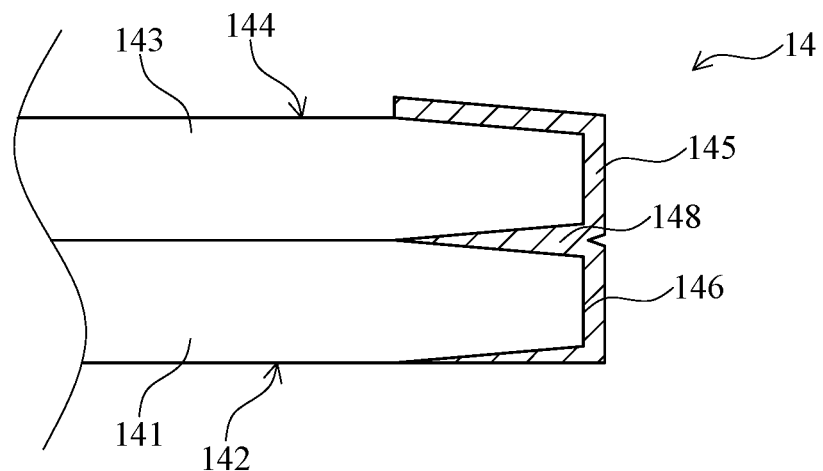
FIG. 2 is fragmentary cross-sectional view illustrating a protective layer formed on a lateral surface of a substrate assembly, by the ALD equipment according to one embodiment of the present disclosure.
Figure 3:
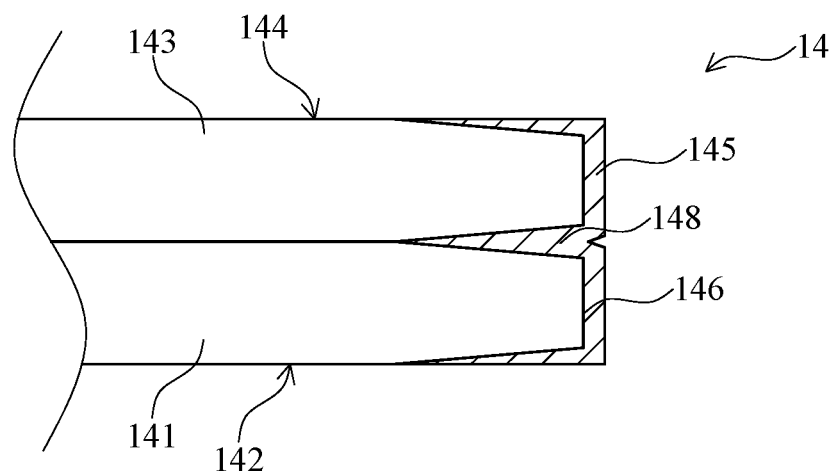
FIG. 3 is fragmentary cross-sectional view illustrating the protective layer formed on the lateral surface of the substrate assembly, by the ALD equipment according to a different embodiment of the present disclosure.

The carrier 13 includes a carrying surface 131 for carrying a substrate assembly 14. In one embodiment of the present disclosure as shown in FIG. 2 and FIG. 3, the substrate assembly 14 includes a first substrate 141 and a second substrate 143 stacked on each other. The first substrate 141 and the second substrate 143 may be wafers which are provided with multiple electronic components (not shown) thereon, by semiconductor manufacturing process.

The substrate assembly 14 is manufactured by several processes. A first process is to align the first substrate 141 and the second substrate 143, and also to align the electronic components on the first substrate 141 with the electronic components on the second substrate 143. Thereafter, a bonding process is applied to the two aligned substrates 141, 143, so as to bond, combine the two substrates 141, 143 into the substrate assembly 14.

The substrate assembly 14 has a proximately plate-like appearance, and includes a first surface 142, a second surface 144 (opposite to the first surface 142) and at least one lateral surface 146. The lateral surface 146 is positioned between the first surface 142 and the second surface 144 and interconnects the two surfaces 142, 143. In more detail, the substrate assembly 14 further includes at least one bonding portion 148 on the lateral surface 146. The bonding portion 148 is formed between the bonded first substrate 141 and the second substrate 143, and defined as an annular cavity on the lateral surface 146 of the substrate assembly 14.

The substrate assembly 14 may be sequentially processed with thinning and through-silicon-via (TSV) at later stage; wherein the TSV is to form vias (small holes) passing through the two substrates 141, 143, and then to fill up those vias with conductor materials (e.g. copper). During the TSV process, the bonding portion 148 on the lateral surface 146 of the substrate assembly 14 may be eroded and breaking off, by an etchant employed to etch and form the vias on the substrate assembly 14; thereby, edge sides of the first substrate 141 and the second substrate 143 may separate and break apart and hence to cause undesired effect to a yield and quality of semiconductor products. For example, when perform a wet-etching TSV process to the substrate assembly 14, the flowing etchant may contact the bonding portion 148 on the lateral surface 146 of the substrate assembly 14, so as to cause erosion and destruction of the bonding portion 148, and hence result in separation of the two substrates 141, 143.

The ALD equipment 10 according to the present disclosure is adapted to perform an atomic-layer-deposition process (hereafter as "ALD process") to the lateral surface 146 and the bonding portion 148 of the substrate assembly 14, and to form a protective layer 145 on the lateral surface 146. The protective layer 145 may be made of silica for example. By virtue of the protective layer 145, it is able to protect the lateral surface 146 and/or the bonding portion 148 of the substrate assembly 14 from being contacted and eroded by the etchant.

The coverage mechanism 15 of the ALD equipment 10 is disposed to face the carrying surface 131 of the carrier 13. When the substrate assembly 14 is placed on the carrying surface 131, the coverage mechanism 15 then faces the substrate assembly 14 on the carrier 13. To be specific, at this moment, the first surface 142 of the substrate assembly 14 contacts and is covered by the carrying surface 131 of the carrier 13; on the other side, the second surface 144 of the substrate assembly 14 faces the coverage mechanism 15.

In one embodiment of the present disclosure, the coverage mechanism 15 includes a cover plate 151 and a connecting shaft 153. The cover plate 151 is disposed within the containing space 12 to face the carrying surface 131 and the carrier 13 and/or the second surface 144 of the substrate assembly 14. The connecting shaft 153 interconnects the reaction chamber 11 and the cover plate 151. The cover plate 151 and/or the connecting shaft 153 is(are) movable with respect to the carrier 13 and/or the reaction chamber 11. Furthermore, the connecting shaft 153 is configured to extend through (penetrate) the reaction chamber 11, and is connected to the cover plate 151 within the containing space 12. On the other side, the cover plate 151 is formed with a plate-like appearance corresponding to a shape of the second surface 144 of the substrate assembly 14, for covering the second surface 144.

The carrier 13 is connected to an elevating mechanism 19, driven by the elevating mechanism 19 to move with respect to the cover plate 151 within the containing space 12, so as to adjust a distance between the carrier 13 and the cover plate 151 of the coverage mechanism 15. In more detail, the elevating mechanism 19 includes a motor 191 and a drive shaft 193 (e.g. leadscrew); wherein the motor 191 moves the carrier 13 by driving the drive shaft 193 to ascend or descend. The elevating mechanism 19 is commonly employed in the ALD equipment and well known by person having ordinary skill in the art, the detailed description of the elevating mechanism 19 is omitted hereinafter.

The dispensing unit 17 is annular-shaped and disposed to surround the cover plate 151. Furthermore, the dispensing unit 17 is fluidly connected to the containing space 12 of the reaction chamber 11 and configured to transfer and dispense at least one precursor toward the lateral surface 146 of the substrate assembly 14, so as to form a protective layer 145 on the lateral surface 146 of the substrate assembly 14.

In more detail, the dispensing unit 17 further includes a first annular pipeline 171, and a plurality of first gas inlets 172. The first annular pipeline 171 surrounds the cover plate 151, and the first gas inlets 172 fluidly interconnect the first annular pipeline 171 and the containing space 12. Moreover, the first gas inlets 172 are disposed to face the cover plate 151 or an underside of the cover plate 151. Thereby, the first annular pipeline 171 can transfer at least one precursor into the containing space 12, for forming a protective layer 145 on the substrate assembly 14.

The first gas inlets 172 may be disposed in an inclined manner relative to the carrying surface 131 of the carrier 13, so as to facilitate dispensing the precursor onto the lateral surface 146 of the substrate assembly 14.

In another embodiment of the present disclosure, the dispensing unit 17 may include a second annular pipeline 173 and a plurality of second gas inlets 174. The second annular pipeline 173 is disposed radially-outer than the first annular pipeline 171, and hence disposed in a manner of surrounding the first annular pipeline 171. The second gas inlets 174 fluidly interconnect the second annular pipeline 173 and the containing space 12. In practical use, a non-reactive gas may be transferred into the second annular pipeline 173, and then be further transferred into the containing space 12 via the second gas inlets 174, wherein the non-reactive gas may be nitrogen or argon.

As shown in FIG. 1, each of the second gas inlets 174 is disposed around the carrier 13 and arranged along an extending line (e.g. axis) substantially vertical to the carrying surface 131 thereof, and also positioned at a radially-outer side of the carrier 13. The second annular pipeline 173 is configured to transfer and dispense the non-reactive gas into the containing space 12 via the second gas inlets 174, so as to create a gas barrier to surround the carrier 13, for retaining, keeping the precursor (from the first gas inlets 172) within.

In practical use, the elevating mechanism 19 can move the carrier 13 and the substrate assembly 14 thereon toward the coverage mechanism 15, such that the cover plate 151 of the coverage mechanism 15 contacts and covers the second surface 144 of the substrate assembly 14. At this moment, the substrate assembly 14 is surrounded by the dispensing unit 17 and/or the first gas inlets 172 thereof with the first gas inlets 172 facing the lateral surface 146 of the substrate assembly 14, then the first gas inlets 172 can dispense the precursor to the lateral surface 146, so as to form a protective layer 145 on the lateral surface 146 and the bonding portion 148 of the substrate assembly 14.

As shown in FIG. 1, the containing space 12 of the reaction chamber 11 may be disposed with an extraction ring 16 which includes at least one extraction hole 162, and an extraction pipeline 164 beneath the extraction ring 16. During the ALD process for forming the protective layer 145, the dispensing unit 17 and the substrate assembly 14 carried by the carrier 13 may be positioned above the extraction ring 16, thereby, residual and unused gas or precursor are transferred to the extraction pipeline 164 through the extraction hole 162 of the extraction ring 16, and flushed out from the extraction pipeline 164.

In another embodiment of the present disclosure, the dispensing unit 17 may include a plurality of third gas inlets 176. The third gas inlets 176 fluidly interconnect the first annular pipeline 171 and the containing space 12. To be specific, the third gas inlets 176 are disposed to the lateral surface 146 of the substrate assembly 14, wherein the first annular pipeline 171 also transfers and dispenses the precursor to the lateral surface 146 of the substrate assembly 14 via the third gas inlets 176. As shown in FIG. 1, the third gas inlets 176 and the first gas inlets 172 may be disposed in different angles, so as to have the third gas inlets 176 be inclined lower than the first gas inlets 172 for example, thereby to dispense the precursor in a wider range within the containing space 12, for example.

Moreover, when the cover plate 151 contacts the second surface 144 of the substrate assembly 14, the elevating mechanism 19 further drives the carrier 13 and the substrate assembly 14 to move toward the coverage mechanism 15 (upward in FIG. 1), so as to slightly push the cover plate 151 of the coverage mechanism 15 upward, thereby to ensure that the cover plate 151 tightly contacts and covers the second surface 144 of the substrate assembly 14. At this moment, the first surface 142 and the second surface 144 of the substrate assembly 14 are respectively covered by the carrier 13 and the cover plate 151 in a tight manner, thereby to ensure that the protective layer 145 is only formed on the lateral surface 146 of the substrate assembly 14.

In practical use, the cover plate 151 may has an area size slightly smaller than that of the substrate assembly 14 (the first and second surfaces 142, 144), such that, the cover plate 151 partially contacts and covers the second surface 144 of the substrate assembly 14, thus an edge side of the second surface 144 is uncovered by the cover plate 151 and exposed under the precursor during the process. In this case, the protective layer 145 formed on the lateral surface 146 may also grow to the edge side of the second surface 144, as shown in FIG. 2.

Alternatively, as shown in FIG. 3, if the cover plate 151 is formed with an area size equal to or larger than that of the substrate assembly 14, the cover plate 151 fully, entirely covers the second surface 144 thereof, such that the precursor is retained, kept around the lateral surface 146 of the substrate assembly 14 and hence to form the protective layer 145 only on the lateral surface 146, in a more trimmed manner.

Moreover as shown in FIG. 1, the carrier 13 may include a first heater 133, while the coverage mechanism 15 may include a second heater 157 (disposed adjacent or within the cover plate 151). The first heater 133 and the second heater 157 are for respectively heating the first surface 142 and the second surface 144 of the substrate assembly 14, in order to facilitate the reaction of forming the protective layer 145 on the lateral surface 146 of the substrate assembly 14.

Also, in addition, the reaction chamber 11 may have a top portion (upside of FIG. 1) disposed with at least one inlet pipeline 113 (plural in this embodiment). Those inlet pipelines 113 may be arrayed in an circular manner for example, and those inlet pipelines 113 are configured to face a top surface of the cover plate 15, for transferring a non-reactive gas onto the top surface, so as to form a gas barrier thereon, in order to retain and restrain a flow path of the precursor transferred by the dispensing unit 17

In one embodiment, the reaction chamber 11 may have the aforementioned top portion formed with a through hole 111 which is connected to the containing space 12. The connecting shaft 153 extends through and movably disposed within the through hole 111. Therefore, the connecting shaft 153 can extend from the top portion of the reaction chamber 11 toward the carrying surface 131 of the carrier 13, or can leave and return from the carrying surface 131 of the carrier 13. Furthermore, the connecting shaft 153 may be disposed with a stopper 1531. The stopper 1531 protrudes radially-outward from surface of the connecting shaft 153. Also to mention that the stopper 1531 is positioned outside of the containing space 12 of the reaction chamber 11, and formed with an area size slightly larger than the area size of the through hole 111 thereon.

In one embodiment of FIG. 1, the coverage mechanism 15 also includes a weight block 155 connected to the connecting shaft 153. The connecting shaft 153 has one end (downside of FIG. 1) connected to the cover plate 151 and another end (upside of FIG. 1) connected to the weight block 155. By effect of gravity, the weight block 155 constantly drives and presses the cover plate 151 downward and toward the carrier 13 and/or the substrate assembly 14, in order to tightly contact and press and cover the second surface 144 thereof. However, the connecting shaft 153 and the cover plate 151 also possess certain weights themselves for pressing the substrate assembly 14 on the carrier 13, therefore it is optional to employ the weight block 155.

In an alternative manner of operation, according to an initially arranged relative position between the coverage mechanism 15 and the carrier 13, the cover plate 151 may move downward by the weight and gravity until the stopper 1531 contacts and stops at the top portion of the reaction chamber 11, and hence the cover plate 151 is hung at middle with no contact to the substrate assembly 14 on the carrier 13. Thereto, the elevating mechanism 19 then drives the carrier 13 and the substrate assembly 14 thereon to approach and contact the coverage mechanism 15, and further slightly push upward the cover plate 151 and the connecting shaft 153, thereby allowing the cover plate 151 to tightly contact and cover the substrate assembly 14 as well.

Figure 4:
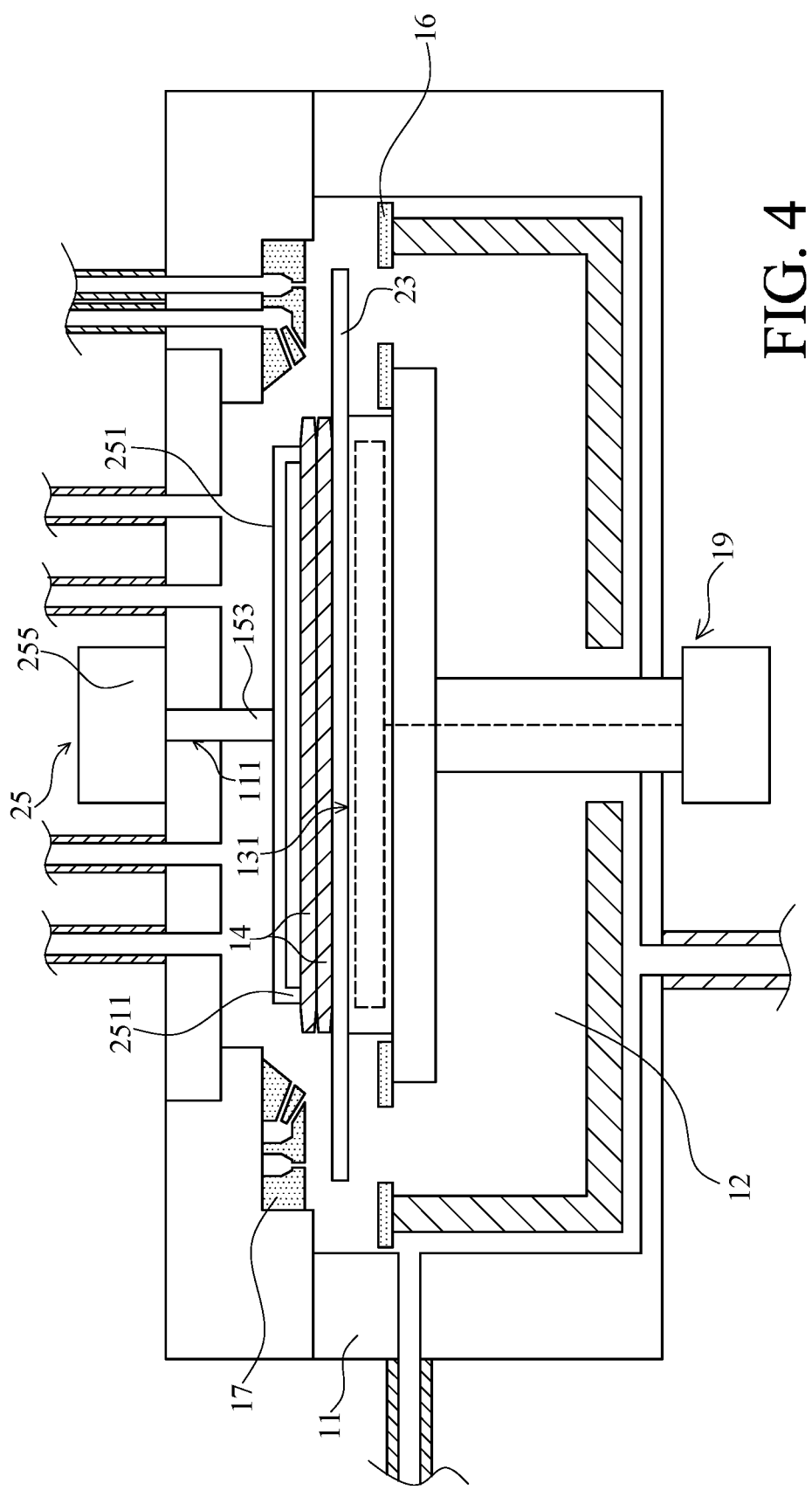
FIG. 4 is a cross-sectional view illustrating the ALD equipment according to another embodiment of the present disclosure.

In another embodiment of the present disclosure as shown in FIG. 4, the coverage mechanism 25 may be configured to include a cover plate 251, the aforementioned connecting shaft 153 and a motor 255. The motor 255 is mounted, fastened on the reaction chamber 11 and power-transmittably connected to the cover plate 251 via the connecting shaft 153 (e.g. with leadscrew mechanism), so as to drive the connecting shaft 153 to move the cover plate 251 with respect to the carrier 13, thereby the cover plate 251 can move closer to contact and cover the second surface 144 of the substrate assembly 14, or move away therefrom.

In practical use, the elevating mechanism 19 may first be controlled to move the carrier 13 and the substrate assembly 14 to ascend to a preset position, the motor 255 then drives the connecting shaft 153 to move the cover plate 251 toward the carrier 13, until the cover plate 251 contacts and covers the second surface 144 of the substrate assembly 14 on the carrier 13. In a different manner of operation, according to a thickness of the substrate assembly 14, the motor 255 may first drive the cover plate 251 to move and descend to a preset position, on next, the elevating mechanism 19 then moves the carrier 13 and the substrate assembly 14 thereon to approach and contact the cover plate 251.

In another different embodiment, the cover plate 251 may have a surface (bottom surface) facing the carrier 13 and formed with an annular wall 2511. The annular wall 2511 is formed at an edge side of the bottom surface on the cover plate 251, and protrudes toward the carrier 13. When the cover plate 251 comes to cover the second surface 144 of the substrate assembly 14, only a protruding end of the annular wall 251 contacts the edge side of the second surface 144.

In one embodiment as shown in FIG. 4, the carrier 13 may include an extension platform 23 disposed on the carrying surface 131. The extension platform 23 may be a plate formed with an area size which is larger than that of the carrying surface 131, and which is large enough to extend to and reach extending lines (e.g. axes) of the first gas inlets 172 and the second gas inlets 174 (may also reaching axes of the third gas inlets 176). By virtue of the extension platform 23, it is able to retain and keep the gas barrier formed by the second gas inlets 174 thereon, and hence to concentrate the precursor from the first gas inlets 172 around the lateral surface 146, and thereby to facilitate forming the protective layer 145 thereon.

In an alternative embodiment, carrying surface 131 of the carrier 13 itself may be formed with an area size large enough to extend to and reach the extending lines of the first gas inlets 172 and the second gas inlets 174 (may also reach the underside of the third gas inlets 176), such that there is no need of the extension platform 23.

Figure 5:
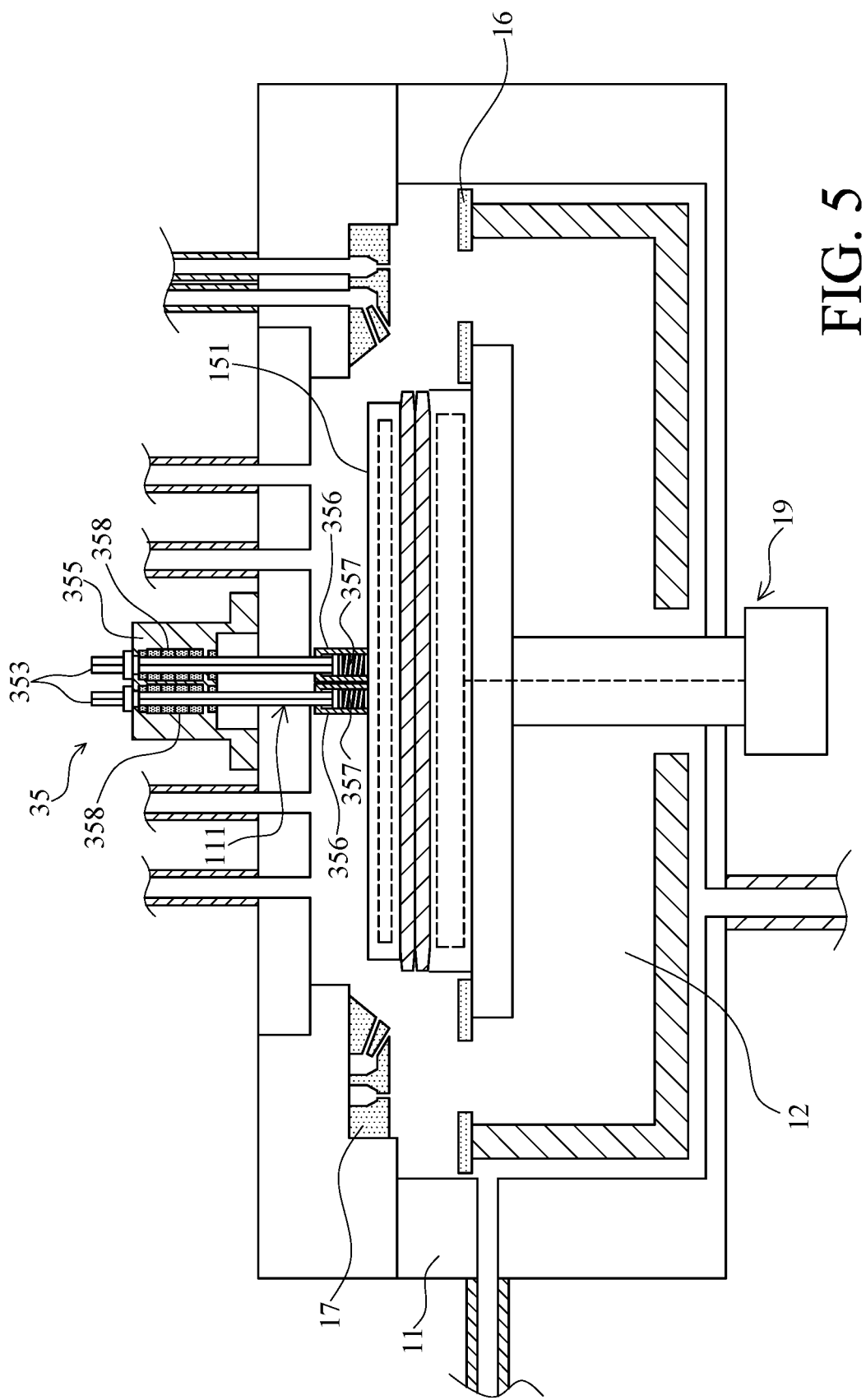
FIG. 5 is a cross-sectional view illustrating the ALD equipment according to one more different embodiment of the present disclosure.

In yet another embodiment of the present as shown in FIG. 5, the coverage mechanism 35 may be configured to include the aforementioned cover plate 151, two connecting shafts 353, a mounting seat 355 and two resilient units 357. The connecting shaft 153 has one end within the containing space 12 of the reaction chamber 11 and connected to the cover plate 151, and has the other end outside of the reaction chamber 11 and connected to the mounting seat 355. The resilient unit 357 is disposed between the mounting seat 355 and the reaction chamber 11, also, the resilient unit 357 may be such as a spring which is loaded to sleeve the connecting shaft 153, and resilient unit 357 has one end abutting the mounting seat 355 and another end abutting the top portion of the reaction chamber 11.

In more detail, the mounting seat 355 is disposed, mounted on the top portion of the reaction chamber 11 where the through hole 111 is disposed, the two connecting shafts 353 extend through the mounting seat 355 and the through hole 111 into the containing space 12. Furthermore, the mounting seat 355 includes two shaft seal units 358 which respectively surround the connecting shafts 353 tightly, for maintaining a vacuum condition within the containing space 12 of the reaction chamber 11. Specifically, each of the shaft seal units 358 may include a plurality of bearings and dynamic shaft seals. Moreover, within the containing space 12, each of the two connecting shafts 353 is connected to the cover plate 151 via a resilient unit 357, further with a collar jacket 356 to surround the resilient unit 357 and a portion of the connecting shaft 353, so as to hold and lock the resilient unit 357 and the connecting shaft 353 together, also, the collar jacket 356 is disposed in a slidable manner with respect to the connecting shaft 353.

In one embodiment of the present disclosure, each of the resilient units 357 may be a spring, preferably a compression spring, for example. Therewith, as the elevating mechanism 19 moves the carrier 13 and the substrate assembly 14 to contact the cover plate 151 and further push the cover plate 151 upward, such that, the resilient units 357 between the cover plate 151 and the connecting shafts 353 deform and also generate a downward resilient force, for the cover plate 151 to squeeze and fasten the substrate assembly 14 with the carrier 13.

More to mention, each of the two connecting shafts 353 may be provided with a thread portion which is threadedly engaged with the mounting seat 355, thereby, height levels of the two connecting shafts 353 are adjustable. For example, to turn one of the connecting shafts 353 back or forth in an up-down direction, while another connecting shaft 353 is fixed and stationary, it is able to offset, balance a parallelism of the cover plate 151 and the carrier 13, and so as to tightly secure and completely cover the substrate assembly 14 from both sides.

It should be noted, the cover plate 151 of the coverage mechanism 15 is mainly for covering the second surface 144 of the substrate assembly 14, therefore, the cover plate 151, the connecting shaft 153, the weight block 155, the base 355 and resilient unit 357 are all configured with suitable amount of weight and force, so as to prevent the cover plate 151 from damaging the substrate assembly 14 with excessive weight or force during the contact therebetween.

For more, based on the abovementioned embodiments, the present disclosure also provides an atomic-layer-deposition (ALD) method performed the aforementioned ALD equipment, which is mainly employed for forming protective layer 145 on a substrate assembly 14. The ALD method basically includes the following processes:

(a) placing a substrate assembly 14 on the carrier 13;
(b) covering a second surface 144 of the substrate assembly 14 on the carrier 13 by utilizing the cover plate 151 of the coverage mechanism 15; and
(c) transferring and dispensing at least one precursor to the lateral surface 146 of the substrate assembly 14 by utilizing the dispensing unit 17, so as to form protective layer 145 on the lateral surface 146 of the substrate assembly.

Also, in one embodiment of the present disclosure, during the process (b), an additional step may be employed, which is to utilize the elevating mechanism 19 to move the carrier 13 and the substrate assembly 14 thereon toward the cover plate 151 of the coverage mechanism 15, so as to allow the cover plate 151 to cover the second surface 144 of the substrate assembly 14. Therewith, another additional step may be employed, which is to utilize a motor 255 to drive and move the cover plate 151 of the coverage mechanism 15 toward the carrier 13 and the substrate assembly 14 thereon, via the connecting shaft 153.

Moreover, during the process (c), an additional step may also be employed, which is to transfer a non-reactive gas into the containing space 12 of the reaction chamber 11, to form a gas barrier to surround the carrier 13, and thereby to retain, keep the precursor around the lateral surface 146 of the substrate assembly 14, and hence to facilitate forming the protective layer 145 thereon.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. An atomic-layer-deposition equipment, comprising:
a reaction chamber, comprising a containing space;
a carrier, disposed within the containing space and including a carrying surface;
a coverage mechanism comprising:
 a cover plate, disposed within the containing space and facing the carrying surface of the carrier; and
 a connecting shaft, interconnecting the reaction chamber and the cover plate; wherein the carrier is configured to be moved to approach the cover plate; and
a dispensing unit, disposed to surround the cover plate and fluidly connected to the containing space of the reaction chamber; wherein the dispensing unit is configured to transfer and dispense at least one precursor into the containing spacer;
wherein the dispensing unit comprises a first annular pipeline and a plurality of first gas inlets; the first annular pipeline surrounds the cover plate; and the first gas inlets are fluidly connected to the first annular pipeline, and the first gas inlets face the cover plate or an underside of the cover plate, for transferring and dispensing the at least one precursor into the containing space.

2. The atomic-layer-deposition equipment according to claim 1, wherein the dispensing unit comprises a second annular pipeline and a plurality of second gas inlets; the second annular pipeline surrounds the first annular pipeline; and the second annular pipeline is configured to transfer a non-reactive gas into the containing space of the reaction chamber via the second gas inlets.

3. The atomic-layer-deposition equipment according to claim 2, wherein each of the second gas inlets of the dispensing unit is arranged along an extending line, and the extending lines are located around the carrier.

4. The atomic-layer-deposition equipment according to claim 2, wherein the carrier comprises an extension platform; and the extension platform extends to and reaches extending lines of the first gas inlets and the second gas inlets.

5. The atomic-layer-deposition equipment according to claim 2, wherein the carrying surface of the carrier extends to and reaches extending lines of the first gas inlets and the second gas inlets.

6. The atomic-layer-deposition equipment according to claim 1, wherein the dispensing unit comprises a plurality of third gas inlets fluidly connected to the first annular pipeline and the containing space of the reaction chamber, the third gas inlets is configured to transfer the at least one precursor into the containing space, and the third gas inlets and the first gas inlets are disposed in different angles.

7. The atomic-layer-deposition equipment according to claim 1, further comprising an elevating mechanism connected to the carrier and configured to drive and move the carrier with respect to the cover plate of the coverage mechanism and to adjust a distance between the carrier and the cover plate.

8. The atomic-layer-deposition equipment according to claim 7, wherein the elevating mechanism is configured to drive and move the carrier to approach the cover plate of the coverage mechanism, so as to allow the first gas inlets surrounding and disposed in an inclined manner relative to the carrying surface of the carrier.

9. The atomic-layer-deposition equipment according to claim 1, wherein the coverage mechanism comprises a motor for driving and moving the cover plate of the coverage mechanism with respect to the carrier via the connecting shaft.

10. The atomic-layer-deposition equipment according to claim 1, wherein the reaction chamber is formed with a through hole connected to the containing space; the connecting shaft extends through the through hole of the reaction chamber and connects to the cover plate within the containing space of the reaction chamber; and the connecting shaft is configured to move with respect to the carrying surface of the carrier.

11. The atomic-layer-deposition equipment according to claim 10, wherein the coverage mechanism further comprises a resilient unit and a mounting seat; the mounting seat is disposed at the through hole of the reaction chamber; the connecting shaft extends through the mounting seat and the through hole into the containing space, and be connected to the cover plate via the resilient unit; and when the carrier moves to approach the cover plate, the resilient unit between the connecting shaft and the cover plate deforms.

12. The atomic-layer-deposition equipment according to claim 10, wherein the coverage mechanism comprises a weight block connected to the connecting shaft; when the carrier moves to approach the cover plate, the weight block applies a pressure on the cover plate.

13. The atomic-layer-deposition equipment according to claim 10, wherein the connecting shaft of the coverage mechanism is disposed with a stopper located outside the containing space of the reaction chamber, and the stopper is formed larger than the through hole of the reaction chamber.

14. The atomic-layer-deposition equipment according to claim 1, wherein the cover plate has a surface facing the carrier, and is configured with an annular wall disposed on an edge side of the surface.

\* \* \* \* \*